US012543583B2

(12) United States Patent
Paek

(10) Patent No.: US 12,543,583 B2
(45) Date of Patent: *Feb. 3, 2026

(54) STACKED DIE MODULES FOR SEMICONDUCTOR DEVICE ASSEMBLIES AND METHODS OF MANUFACTURING STACKED DIE MODULES

(71) Applicant: Micron Technology, Inc., Boise, ID (US)

(72) Inventor: Jong Sik Paek, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/614,579

(22) Filed: Mar. 22, 2024

(65) Prior Publication Data

US 2024/0258243 A1  Aug. 1, 2024

Related U.S. Application Data

(63) Continuation of application No. 17/373,452, filed on Jul. 12, 2021, now Pat. No. 11,942,430.

(51) Int. Cl.
*H01L 23/538* (2006.01)
*H01L 21/48* (2006.01)
(Continued)

(52) U.S. Cl.
CPC ...... *H01L 23/5386* (2013.01); *H01L 21/4846* (2013.01); *H01L 21/566* (2013.01);
(Continued)

(58) Field of Classification Search
CPC ............... H01L 21/566; H01L 21/4846; H01L 21/76871; H01L 21/76879; H01L 23/5386;
(Continued)

(56) References Cited

U.S. PATENT DOCUMENTS 11,024,604 B2   6/2021  Bowers et al.
11,942,430 B2 * 3/2024  Paek ................... H01L 21/4846
(Continued)

FOREIGN PATENT DOCUMENTS

| KR | 20100020518 A | 2/2010 |
| TW | 201347138 A | 11/2013 |
| TW | 201436118 A | 9/2014 |
| TW | 202107659 A | 2/2021 |

OTHER PUBLICATIONS

KR Patent Application No. 10-2024-7004201—Korean Office Action and Search Report, issued Mar. 21, 2024, with English Translation, 19 pages.
(Continued)

*Primary Examiner* — Jasmine J Clark
(74) *Attorney, Agent, or Firm* — Dorsey & Whitney LLP

(57) ABSTRACT

Stacked die modules for semiconductor device assemblies and methods of manufacturing the modules are disclosed. In some embodiments, the module includes a shingled stack of semiconductor dies, each die having an uncovered porch with bond pads. Further, a dielectric structure partially encapsulates the shingled stack of semiconductor dies. The dielectric structure includes openings corresponding to the bond pads. The module also includes conductive structures disposed on the dielectric structure, where each of the conductive structures extends over at least one porch of the semiconductor dies to connect to at least one bond pad through a corresponding opening. The semiconductor device assembly may include a controller die attached to a package substrate, the controller die carrying one or more stacked die modules, and bonding wires connecting terminals of the modules to package bond pads.

20 Claims, 9 Drawing Sheets

(51) Int. Cl.

| | |
|---|---|
| *H01L 21/56* | (2006.01) |
| *H01L 21/768* | (2006.01) |
| *H01L 23/00* | (2006.01) |
| *H01L 23/31* | (2006.01) |
| *H01L 23/498* | (2006.01) |
| *H01L 25/10* | (2006.01) |

(52) U.S. Cl.
CPC ............ *H01L 21/76871* (2013.01); *H01L 21/76879* (2013.01); *H01L 23/3157* (2013.01); *H01L 23/49816* (2013.01); *H01L 23/49838* (2013.01); *H01L 23/49866* (2013.01); *H01L 24/32* (2013.01); *H01L 24/48* (2013.01); *H01L 25/105* (2013.01); *H01L 2224/32145* (2013.01); *H01L 2224/48228* (2013.01); *H01L 2225/1023* (2013.01); *H01L 2225/1052* (2013.01); *H01L 2924/1436* (2013.01); *H01L 2924/1811* (2013.01); *H01L 2924/1815* (2013.01); *H01L 2924/182* (2013.01); *H01L 2924/183* (2013.01)

(58) Field of Classification Search
CPC .......... H01L 23/3157; H01L 23/49816; H01L 23/49836; H01L 23/49866; H01L 25/105
USPC ........................................................ 257/690
See application file for complete search history.

(56) References Cited

U.S. PATENT DOCUMENTS

| | | |
|---|---|---|
| 2009/0166887 A1 | 7/2009 | Upadhyayula et al. |
| 2010/0181661 A1 | 7/2010 | Takemoto et al. |
| 2010/0327461 A1 | 12/2010 | Co et al. |
| 2013/0020720 A1 | 1/2013 | Kim et al. |
| 2015/0200008 A1 | 7/2015 | Ozawa et al. |
| 2015/0221624 A1 | 8/2015 | Bock et al. |
| 2016/0064365 A1 | 3/2016 | Jang et al. |
| 2019/0139934 A1 | 5/2019 | Ng et al. |
| 2020/0411496 A1 | 12/2020 | Zhang et al. |
| 2022/0068877 A1 | 3/2022 | Tai et al. |
| 2023/0009643 A1 | 1/2023 | Paek |

OTHER PUBLICATIONS

International Application No. PCT/US2022/029064—International Search Report and Written Opinion, dated Sep. 15, 2022, 10 pages.
TW Patent Application No. 111119637—Taiwanese Office Action and Search Report, dated Jan. 18, 2023, with English Translation.
CN Patent Application No. 202280053186.X—Chinese Office Action and Search Report, issued Aug. 24, 2024, with English Translation, 13 pages.
EPO extended European search report mailed May 27, 2025 for patent application No. 228442610.2, Applicant: Micron Technology, 9 pages.

\* cited by examiner

STACKED DIE MODULES FOR SEMICONDUCTOR DEVICE ASSEMBLIES AND METHODS OF MANUFACTURING STACKED DIE MODULES

CROSS-REFERENCE TO RELATED APPLICATION(S)

This application is a continuation of U.S. patent application Ser. No. 17/373,452, filed Jul. 12, 2021, now issued as U.S. Pat. No. 11,942,430, which is incorporated herein by reference in its entirety.

TECHNICAL FIELD

The present disclosure generally relates to semiconductor device assemblies, and more particularly relates to stacked die modules for semiconductor device assemblies and methods of manufacturing the stacked die modules.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

Market pressures continually drive semiconductor manufacturers to reduce the size of semiconductor die packages to fit within the space constraints of electronic devices, while also pressuring them to reduce cost associated with fabricating the packages. In some packages, two or more semiconductor dies are stacked on top of each other to reduce the footprint of the packages. In some cases, the semiconductor dies are operatively connected to other components of the packages through bonding wires formed one at a time, which takes a long throughput time. In other cases, the semiconductors dies may include through-substrate vias (TSVs) to facilitate stacking of the semiconductor dies. The TSV technology, however, tends to increase the cost for the manufacturers.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1A:
FIGS. 1A through 1J illustrate stages of a process for forming a semiconductor device assembly in accordance with embodiments of the present technology.

Specific details of several embodiments of semiconductor device assemblies with stacked die modules and methods of manufacturing stacked die modules are described below. The term "semiconductor device or die" generally refers to a solid-state device that includes one or more semiconductor materials. Examples of semiconductor devices (or dies) include logic devices, memory devices, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates (e.g., silicon substrates). In certain semiconductor packages, a package substrate (which may also be referred to as a support substrate, a substrate, or the like) may carry one or more semiconductor dies. In some cases, some of the semiconductor dies are structurally identical to each other (e.g., DRAM dies, NAND memory dies). In other cases, at least one semiconductor die may be a different kind from other semiconductor dies—e.g., a semiconductor package including a memory controller die and one or more memory dies.

Small form-factor packages present challenges for accommodating stacks of semiconductor dies (e.g., DRAM dies, NAND memory dies) on the package substrate. In some embodiments, the semiconductor dies include TSVs to facilitate in-line stacking of the semiconductor dies to reduce the footprint of the stack. In some embodiments, a semiconductor die is flipped (e.g., having its active surface with conductive pillars facing the package substrate) and is directly connected to the package substrate (e.g., conductive pads of the substrate are electrically connected to the conductive pillars of the semiconductor die), which may be referred to as a flip-chip or a direct chip attachment (DCA) scheme. Process steps generating the conductive pillars (and other structures facilitating the conductive pillars to connect to bond pads of the semiconductor die) and connecting the conductive pillars to corresponding conductive pads of the substrate may be referred to as a bumping process. Typically, the TSVs and/or DCA schemes tend to be costly—e.g., in view of various yield and/or reliability issues.

In some cases, wire bonding techniques are combined with the DCA scheme to mitigate the cost of manufacturing semiconductor packages. For example, a controller die is attached to a package substrate using the DCA scheme. Subsequently, a memory die (which may have been thinned to reduce the overall height of the package) is attached to the controller die—e.g., using a die attach film (DAF). In some cases, spacer structures attached to the package substrate support portions of the memory die extending beyond the controller die. Thereafter, wire bonding processes are carried out to connect bond pads of the memory die to the package substrate. The die attach and wire bonding processes can be repeated for additional memory dies subsequently stacked (attached to) on top of the memory die, one at a time.

In some cases, semiconductor packages include eight (8), sixteen (16), or even greater quantities of semiconductor dies (e.g., memory dies stacked on top of a controller die).

The cost (e.g., increased quantity of wire bonding equipment and assembly floor space occupied by them) and the throughput time associated with the wire bonding processes for stacking large quantities of semiconductor dies tend to negate a key benefit of the wire bonding processes—e.g., relatively lower cost. Moreover, if a semiconductor die is stacked on top of another semiconductor die already having a bonding wire formed on its surface, a specialized DAF (e.g., a film-on-wire (FOW)) may need to be disposed between the two semiconductor dies to accommodate the bonding wire without damaging it. Further, if one semiconductor die of the stack is defective (or becomes defective during the die attach and/or wire bonding processes), the semiconductor package as a whole may become non-functional, which in turn, would increase the cost to the semiconductor package manufacturers.

Aspects of the present technology facilitate providing lower cost alternatives for generating semiconductor device assemblies including stacks of semiconductor dies. Namely, the present technology utilizes one or more modules, each module including a plurality of semiconductor dies stacked on top of each other, to build the semiconductor device assemblies. Further, the semiconductor dies within the module are operatively coupled with each other—e.g., through conductive structures described in more detail with reference to FIGS. 1E through 1H. The modules also include terminals coupled to the plurality of semiconductor dies therein such that the terminals can be connected to a variety of external interconnects and/or components—e.g., bonding wires between the terminals and package bond pads of the semiconductor device assemblies, conductive pillars (e.g., interconnects similar to the conductive pillars of the DCA schemes) connecting the terminals to the package bond pads. Each module is encapsulated with its own molding structure with the terminals and a surface of the semiconductor die of the module exposed. Moreover, the modules can be individually tested to confirm their functionality such that known good modules can be used to generate semiconductor device assemblies.

In some embodiments, a controller die is attached to a package substrate using the DCA scheme. Subsequently, a module (e.g., a module including four (4) memory dies stacked on top of another and operatively connected to each other) is attached to the controller die—e.g., using a die attach film (DAF). The module may be mechanically rigid (e.g., four memory dies thick and encapsulated with its own molding structure) such that spacer structures are unnecessary. After attaching the module to the controller die, bonding wires are formed between the terminals of the module and the substrate bond pads to operatively couple the memory dies to the substrate bond pads. Thereafter, a second module (e.g., another module including four (4) memory dies) can be attached on top of the module and the terminals of the second module can be coupled to the substrate bond pads using another set of bonding wires.

In this manner, if the semiconductor device assembly includes sixteen (16) semiconductor dies, four (4) modules, each including four (4) semiconductor dies, can be attached on top of each other, thereby reducing complexities (and risks of having the semiconductor dies damaged) associated with repeating the die attach and wire bonding processes by a factor of 4. The stacked modules (each having its own molding structure with straight sidewalls) absent support structures make it easier to dispose mold underfill materials for the semiconductor device assembly when compared to sixteen (16) individually stacked semiconductor dies supported by the spacer structures. Further, the usage of FOW can be avoided in stacking the modules as the terminals of the modules can be located toward edges of the modules.

Figure 4:
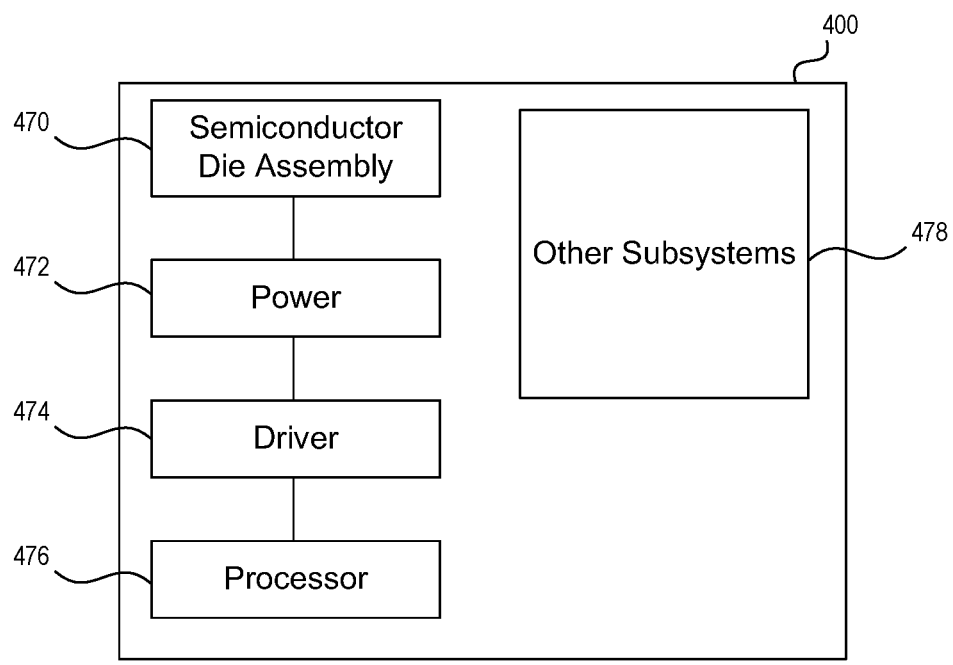
FIG. 4 is a block diagram schematically illustrating a system including a semiconductor die assembly configured in accordance with embodiments of the present technology.
Figure 5:
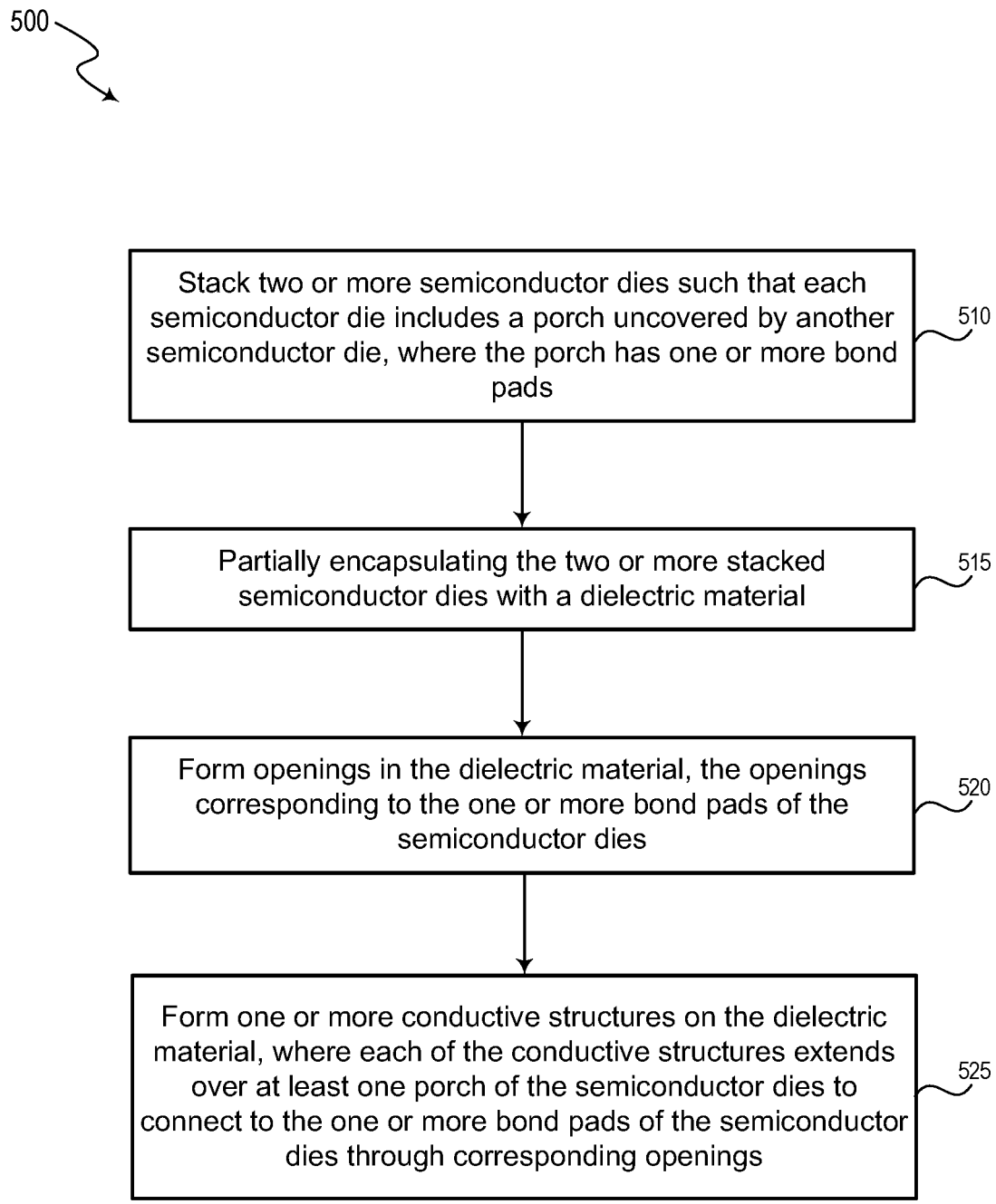
FIG. 5 is a flowchart of a method of forming a semiconductor die assembly configured in accordance with embodiments of the present technology.

FIGS. 1A through 1J describe stages of a process for forming a semiconductor device assembly (e.g., a module including a plurality of semiconductor devices and terminals configured to connect to various interconnects) in accordance with embodiments of the present technology. FIG. 2 illustrates a cross-sectional diagram of a semiconductor die assembly including such modules described with reference to FIGS. 1A-1J. FIGS. 3A through 3E describe stages of a process for forming a semiconductor device assembly including one or more modules that each includes a plurality of semiconductor dies. FIG. 4 describes a system including a semiconductor die assembly configured in accordance with embodiments of the present technology. FIG. 5 is a flowchart of a method of forming a semiconductor die assembly configured in accordance with embodiments of the present technology.

As used herein, the terms "front," "back," "vertical," "lateral," "down," "up," "upper," "lower," "bottom," and "top" can refer to relative directions or positions of features in the semiconductor device assemblies in view of the orientation shown in the Figures. For example, "upper" or "uppermost" can refer to a feature positioned closer to the top of a page than another feature. Similarly, "bottom" or "bottommost" can refer to a feature positioned closer to the bottom of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIGS. 1A through 1J illustrate stages of a process for forming a semiconductor device assembly (e.g., semiconductor die modules, modules including stacked semiconductor dies) in accordance with embodiments of the present technology. FIG. 1A illustrates a carrier 105 and a release layer 110. The carrier 105 may be a glass carrier, a metal carrier, an organic carrier, or a semiconductor carrier (e.g., a semiconductor wafer). In some embodiments, the carrier corresponds to a panel with a greater area than a semiconductor wafer (e.g., 300 mm wafer). The release layer 110 is configured to be removed (e.g., dissolved) to release the semiconductor die modules (e.g., the semiconductor die modules 165 described with reference to FIGS. 1I and 1J) from the carrier 105 when the semiconductor die modules are ready for the subsequent process steps (e.g., singulation steps). Although FIGS. 1B through 1J depict one semiconductor die module to describe the process, it should be noted that multiple semiconductor die modules can be concurrently formed by the process—e.g., forming multiple semiconductor die modules on a semiconductor wafer or on a panel.

Figure 1B:
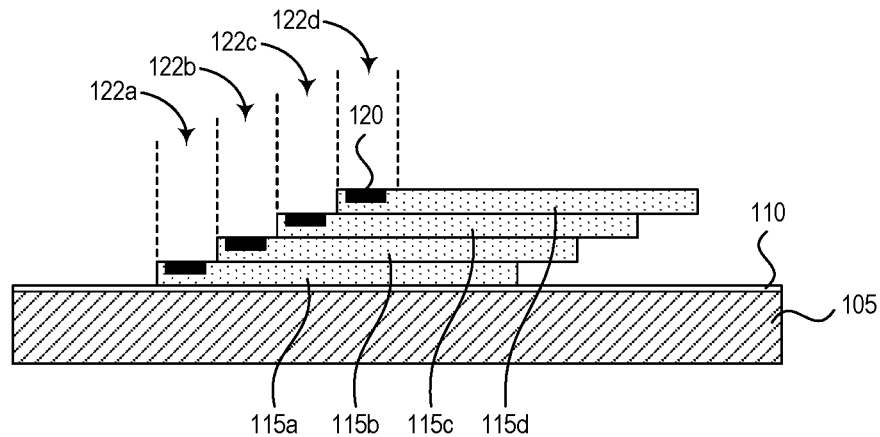
Figure 2:
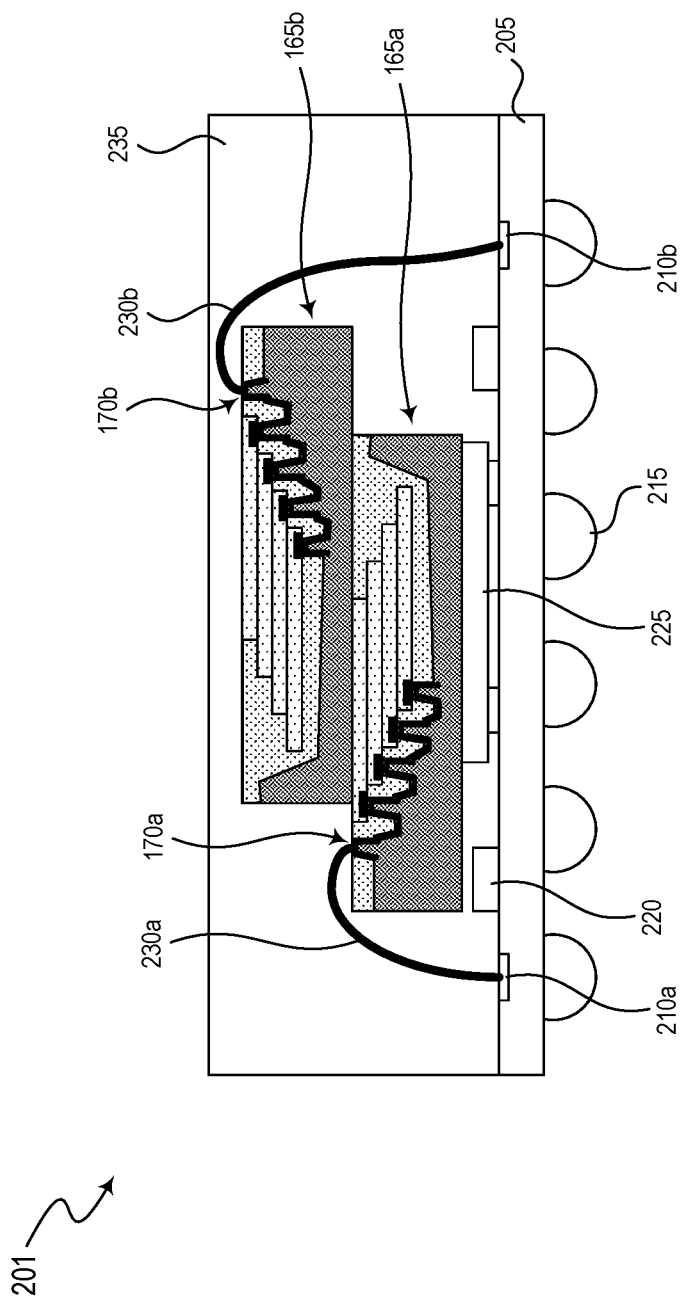
FIG. 2 is a cross-sectional diagram of a semiconductor die assembly in accordance with embodiments of the present technology.

FIG. 1B illustrates that semiconductor dies 115 (also identified individually as 115a through 115d) attached to the release layer 110 (the semiconductor die 115a attached to the release layer 110, the semiconductor die 115b attached to the semiconductor die 115a, and so on). In some embodiments, a die attach film (DAF) (not shown) can be used to attach a semiconductor die (e.g., the semiconductor die 115b) on top of another semiconductor die (e.g., the semiconductor die 115a). Each semiconductor die 115 includes one or more bond pads 120. Further, the semiconductor dies 115 include uncovered porches 122 (also identified individually as 122a through 122d) where the one or more bond pads 120 are located. The porch may be regarded as a portion of the semiconductor die 115 that is not covered by another semiconductor die 115 (or any other semiconductor die for the topmost semiconductor die 115). The stacked semiconductor dies 115 may be referred to as a shingled stack of semiconductor dies 115.

Figure 1C:
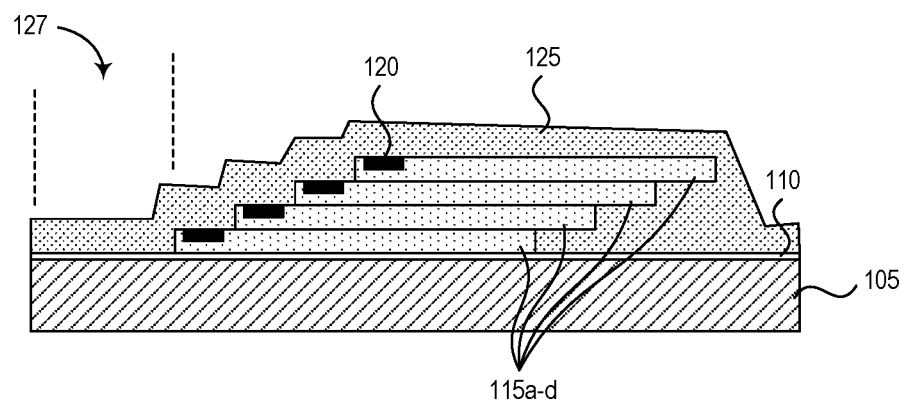

FIG. 1C illustrates that a dielectric material 125 has been deposited on the shingled stack of semiconductor dies 115 (and on the release layer 110). The dielectric material 125 may include at least one of polyimide, spin-on glass, tetraethoxysilane (TEOS), plasma oxide, oxynitride, and/or silicon carbon nitride. In some embodiments, the dielectric material 125 includes polyimide material sensitive to radiation energy (which may be referred to as a photosensitive polyimide (PSPI)). The dielectric material 125 may be regarded as partially encapsulating the shingled stack of semiconductor dies 115 in view of at least one surface of the semiconductor dies (e.g., the surface of the semiconductor die 115a in contact with the release layer 110) not covered by the dielectric material 125. Moreover, the dielectric material 125 extends to an outer region (e.g., the outer region 127) of a footprint of the shingled stack of semiconductor dies 115.

Figure 1D:
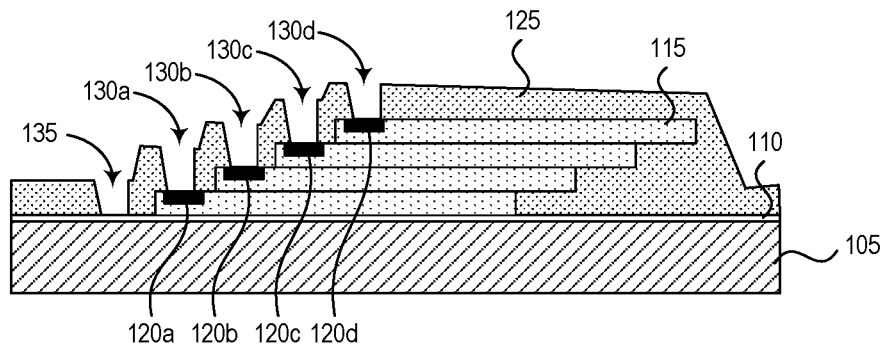

FIG. 1D illustrates that openings 130 (also identified individually as 130a through 130d) has been formed in the dielectric material 125. The openings 130 correspond to the bond pads 120 of the semiconductor dies 115—e.g., individual openings 130 extend to (reach) corresponding bond pads 120. Further, FIG. 1D illustrates that one or more holes 135 are formed in the dielectric material 125 of the outer region 127. The holes 135 extend to (reach) the release layer 110—e.g., the holes 135 penetrate through the dielectric material 125 in the outer region 127. In some embodiments, photolithography and etch process steps (not illustrated) can be carried out to define the openings 130 (and the holes 135) and selectively remove the dielectric material 125 to form the openings 130 (and the holes 135). As such, the openings 130 and the holes 135 may be concurrently formed.

Figure 1E:
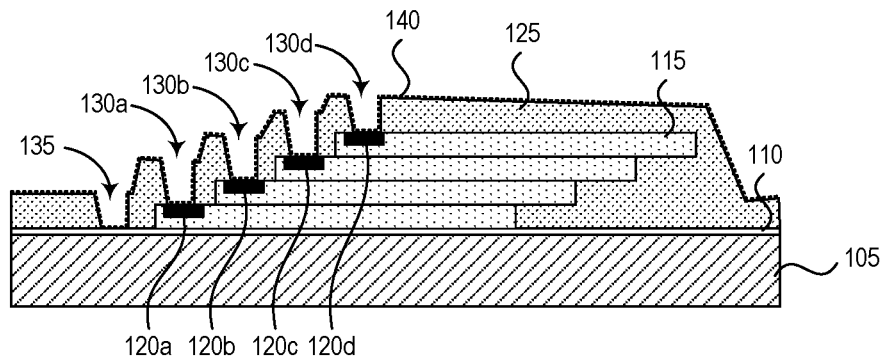

FIG. 1E illustrates that a seed material 140 (e.g., a first conductive material) is deposited on the dielectric material 125. As such, the seed material 140 conforms to the surface contour of the dielectric material 125. Further, the seed material 140 contacts the bond pads 120 and at least partially fills the holes 135. The seed material 125 is electrically conductive and is configured to facilitate subsequent formation of conductive structures on the seed material 125—e.g., forming electroplated copper on the seed material 125.

Figure 1F:
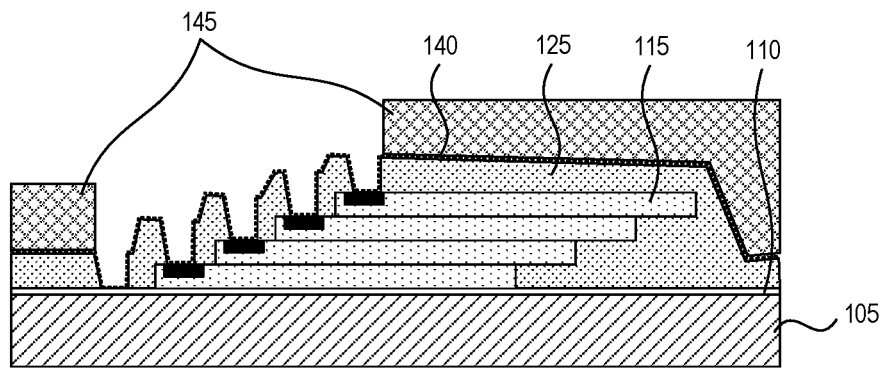
Figure 1G:
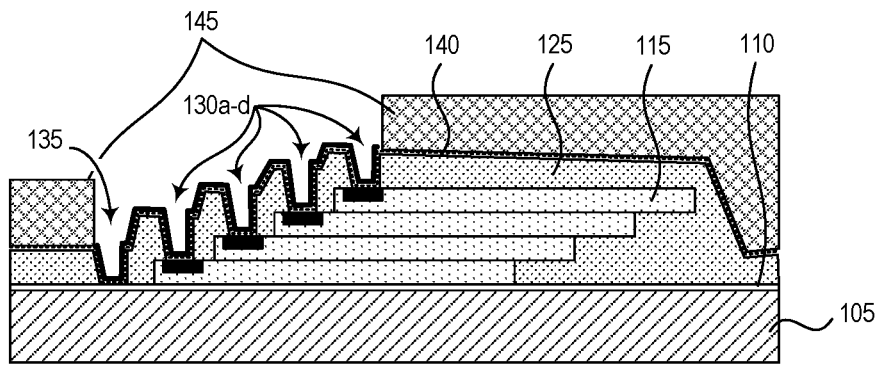
Figure 1H:
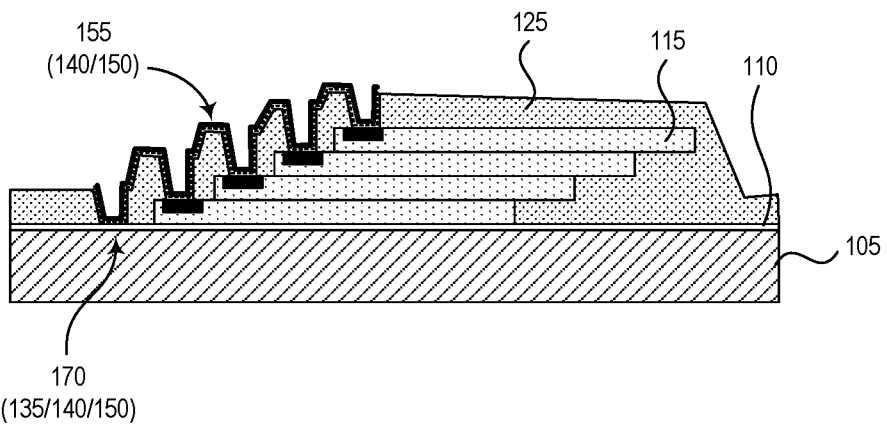

FIG. 1F illustrates that a photoresist 145 has been applied on the seed material 125 and patterned to define areas for forming the conductive structures (e.g., the conductive structures 155 depicted in FIG. 1H). FIG. 1F may be regarded as a cross-sectional view across a line AA' (as depicted in the diagram 101 of FIG. 1J) upon completing the patterning of the photoresist 145. That is, the area absent the photoresist 145 in FIG. 1F corresponds to the conductive structure 155a (as depicted in the diagram 101 of FIG. 1J) that connects the hole 135 and the bond pads 120 depicted in FIG. 1F. It should be noted that the patterning of the photoresist 145 (e.g., removing the photoresist 145 from the areas where the conductive structures 155 are formed) may include different groups of the bond pads 120 (and the holes 135) based on electrical routing specifications for the semiconductor dies 115 of the module.

FIG. 1G illustrates that a conductive material 150 (e.g., a second conductive material) has been formed on the seed material 140 uncovered by the photoresist 145. In some embodiments, the conductive material 150 corresponds to copper electroplated on the exposed seed material 140. In other embodiments, the conductive material 150 corresponds to a conductive material deposited (e.g., using a sputter process) on the seed material 140 (or a suitable conductive interface material). Further, the conductive material 150 at least partially fills the holes 135.

FIG. 1H illustrates that the photoresist 145 has been removed after forming the conductive material 150 (e.g., the electroplated copper). Further, the seed material 140 exposed after removing the photoresist 145 (i.e., the seed material 140 uncovered by the conductive material 150) has been also removed. At this stage, one or more conductive structures 155 (including the seed material 140 and the conductive material 150) are completed to electrically couple the semiconductor dies 115 to each other. Further, the conductive structures 155 provide external connections for the semiconductor dies 115 through the holes 135 that has been at least partially filled with the seed material 140 and the conductive material 150. In other words, as depicted in FIGS. 1H (and 1J), the holes 135 including the seed material 140 and the conductive material 150 form terminals 170 for the modules 165.

It should be noted that the conductive structures 155 are concurrently formed for the module 165 (and on all other modules on the carrier 105), thereby providing efficient and low-cost alternatives that may replace wire bonding processes. Moreover, the conductive structures 155 conform to corresponding surface profiles (e.g., surface topology, surface contour, surface configuration) of the dielectric structure. Although certain aspects of generating the conductive structures 155 are described with reference to electroplating process steps (e.g., electroplating copper on a seed material), the present technology is not limited thereto. For example, the conductive structures 155 can be generated by depositing the conductive material 150 (e.g., utilizing a sputtering process, a physical vapor deposition (PVD) process, or a suitable process to deposit a conductive material) on the seed material 140 (or a suitable conductive interface material) uncovered by the photoresist 145. Subsequently, the conductive material 150 deposited on the photoresist 145 can be removed (e.g., lifted off) when the photoresist 145 is removed.

Figure 1I:
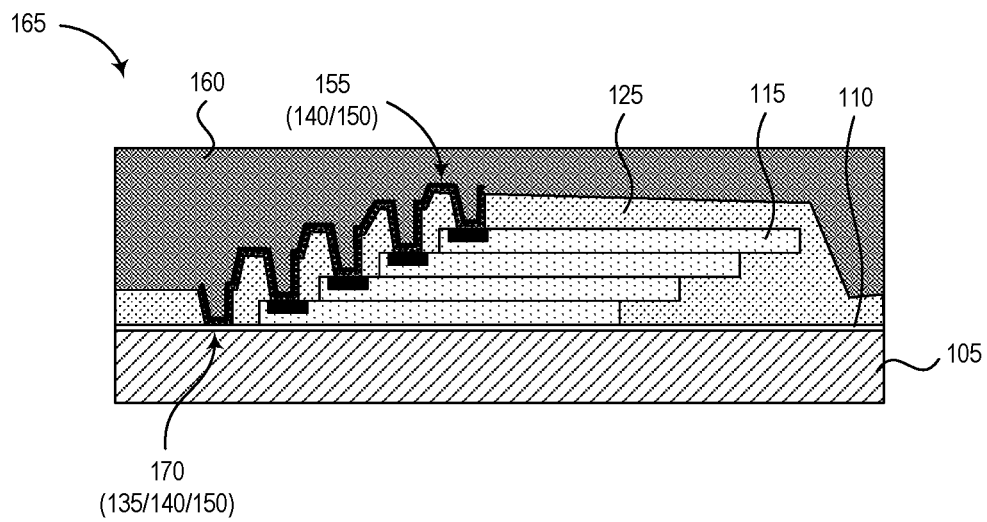

FIG. 1I illustrates that a molding structure 160 is formed over the conductive structures 155 and the dielectric material 125. Subsequently, the carrier 105 is detached from the module 165—e.g., by removing the release layer 110. Individual modules 165 are singulated after detaching the carrier 105.

Figure 1J:
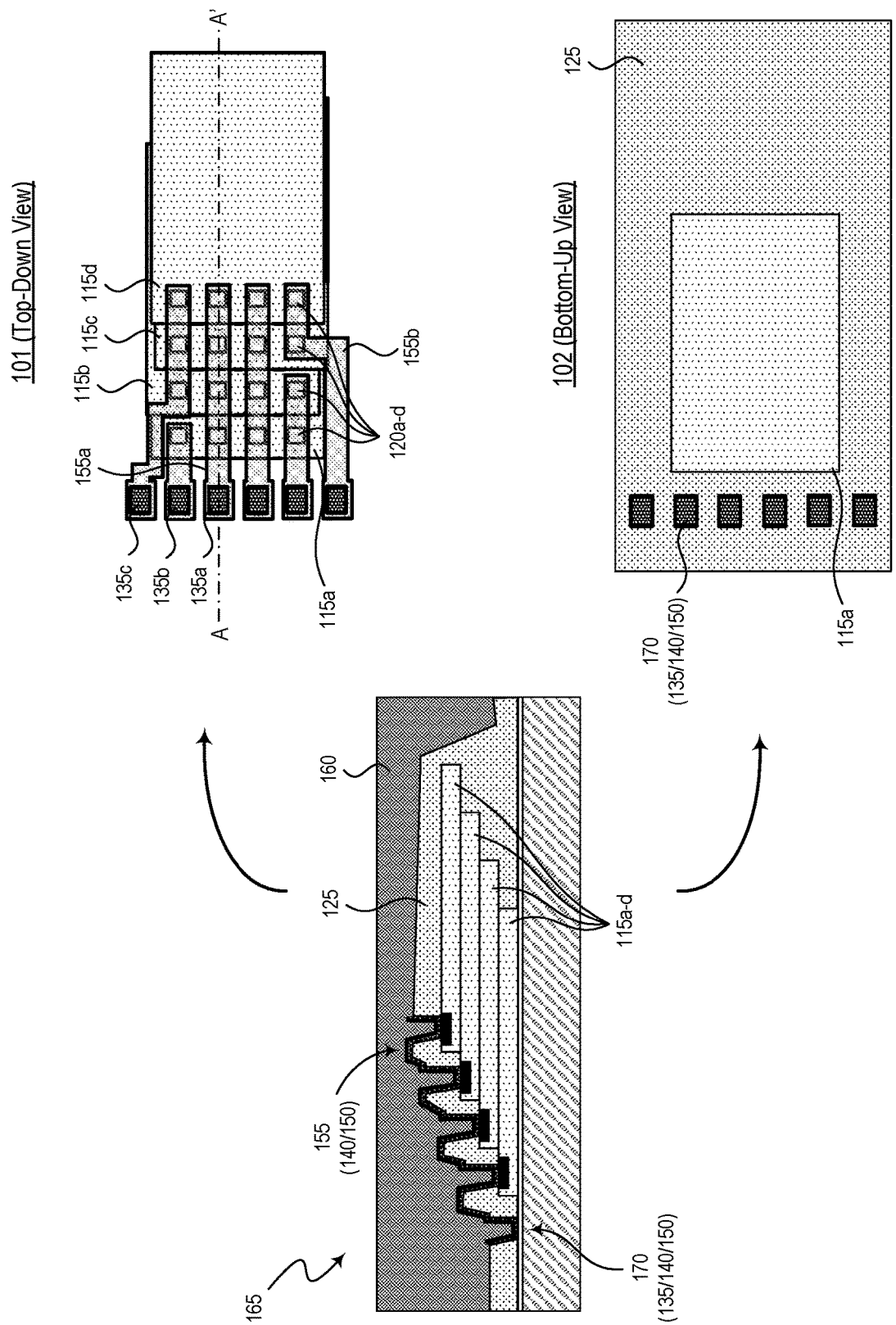

FIG. 1J illustrates that the module 165 after completing the singulation steps. FIG. 1J also depicts a top-down view diagram 101 and a bottom-up view diagram 102 of the module 165. At this stage, the module 165 may be tested (using the terminals 170) to confirm functionality of the module 165. Further, the module 165 may be coupled with a variety of components and/or substrates. For example, the module 165 can be attached to a package substrate including other components (e.g., a controller, a host device) or to an interface wafer (e.g., including interface dies) to form chips on wafers (COW). In other examples, the module 165 can be attached to a controller that has been DCA mounted to a package substrate to form a semiconductor device assembly.

The top-down view diagram 101 illustrates that the conductive structures 155 are configured to connect the bond pads 120 of the semiconductor dies 115 such that the semiconductor dies 115 can be coupled to each other. Moreover, the conductive structures 155 couple the bond pads 120 of the semiconductor dies 115 to the holes 135 including the seed material 140 and the conductive material 150 (i.e., terminals 170). In this manner, the conductive structures 155 provide external connections for the semiconductor dies 115 of the module 165. As shown in the diagram 101, the conductive structures 155 may include different groups of the bond pads 120 (and the holes 135) based on electrical routing specifications of the module 165 (and the semiconductor dies 115 included in the module 165). The diagram 101 depicts individual semiconductor dies 115 (also identified individually as 115a-d) that are offset from each other in the direction perpendicular to the line AA' to clearly illustrate edges of different semiconductor dies 115 that are stacked on top of another, but the present technology is not limited as such. For example, edges of the semiconductor dies 115 may be aligned to a line parallel to the line AA'.

The bottom-up view diagram 102 illustrates that the terminals 170 are exposed to facilitate external connections to the module 165. Further, the surface of the bottommost semiconductor die 115a is exposed after the carrier 105 is detached from the module 165. Although the module 165 is described to include four (4) semiconductor dies 115 for illustration purposes, the present technology is not limited thereto. For example, the module 165 may include less quantities of semiconductor dies 115—e.g., two or three. In other examples, the module 165 may include greater quantities of semiconductor dies 115—e.g., five (5), eight (8), twelve (12), or even greater.

In some embodiments, a semiconductor die assembly includes a shingled stack of semiconductor dies, each semiconductor die of the stack having an uncovered porch with one or more bond pads, a dielectric structure partially encapsulating the shingled stack of semiconductor dies, where the dielectric structure includes openings corresponding to the bond pads of the semiconductor dies, and one or more conductive structures on the dielectric structure, where each of the conductive structures extends over at least one porch of the semiconductor dies to connect to the one or more bond pads of the semiconductor dies through corresponding openings of the dielectric structure.

In some embodiments, the dielectric structure includes an outer portion extending outside of a footprint of the shingled stack of semiconductor dies, where the outer portion includes one or more holes that are at least partially filled with a conductive material of the one or more conductive structures. In some embodiments, the one or more conductive structures are configured to couple with external interconnects at bottoms of the one or more holes. In some embodiments, the one or more conductive structures include a conductive seed material and a layer of copper formed (e.g., electroplated) on the conductive seed material. In some embodiments, the one or more conductive structures conform to corresponding surface profiles of the dielectric structure. In some embodiments, the dielectric structure includes at least one of polyimide, spin-on glass, tetraethoxysilane (TEOS), plasma oxide, oxynitride, and/or silicon carbon nitride. In some embodiments, the semiconductor die assembly further includes a molding structure over the dielectric structure and the one or more conductive structures. In some embodiments, the bottommost semiconductor die of the stack includes a side uncovered by the dielectric structure (and by the molding structure, in some cases).

FIG. 2 is a cross-sectional diagram of a semiconductor die assembly 201 in accordance with embodiments of the present technology. The semiconductor die assembly 201 is depicted to include a first semiconductor die 225 attached to a package substrate 205 including substrate bond pads 210 (also identified individually as substrate bond pads 210a/b).

In some embodiments, the first semiconductor die 225 is a controller (e.g., a memory controller) directly attached to the package substrate 205—e.g., using DCA techniques. The semiconductor die assembly 201 may include one or more passive components 220 (e.g., capacitors) attached to the package substrate 205—e.g., using surface mount techniques (SMT). The semiconductor die assembly 201 may also include package terminals 215 (e.g., ball grid array (BGA)). The package substrate 205 includes interconnect structures (e.g., metallic traces, conductive vias, etc.) to provide electrical routings for the various components of the semiconductor die assembly 201—e.g., the first semiconductor die 225, the passive components 220, the modules 165a/b, the package terminals 215.

Further, the semiconductor die assembly 201 is depicted to include two semiconductor die modules 165 (also identified individually as modules 165a/b) described with reference to FIG. 1J. The module 165a may be attached to the first semiconductor die 225 using a DAF (not shown). The module 165a is flipped (upside down) in comparison to the module 165 of FIG. 1J such that its terminal 170a faces away from the package substrate 205. A bonding wire 230a couples the terminal 170a with the substrate bond pad 210a. The semiconductor die assembly 201 also includes another module 165b attached to the module 165a—e.g., using a DAF (not shown). A bonding wire 230b couples the terminal 170b of the module 165b with the substrate bond pad 210b. In this manner, the wire bonding process steps can be significantly simplified—e.g., eight (8) times of performing the wire bonding process steps for eight (8) individual semiconductor dies 115 of the semiconductor die assembly 201 to 2 times of performing the wire bonding process steps for two modules 165a/b. The semiconductor die assembly 201 includes a molding structure 235 encapsulating the modules 165a/b and the bonding wires 230a/b.

Figure 3A:
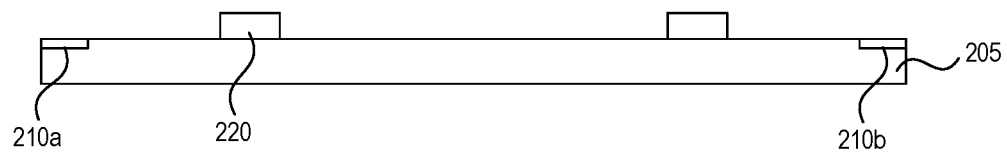
FIGS. 3A through 3E illustrate stages of a process for forming a semiconductor device assembly in accordance with embodiments of the present technology.
Figure 3B:
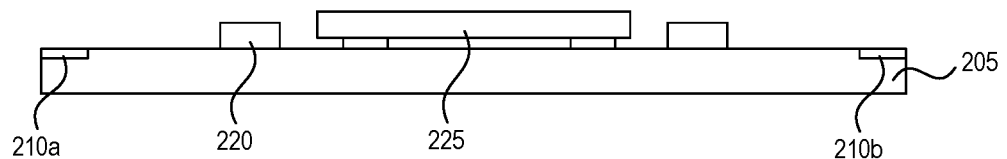

FIGS. 3A through 3E illustrate stages of a process for forming a semiconductor device assembly (e.g., the semiconductor die assembly 201) in accordance with embodiments of the present technology. FIG. 3A illustrates the package substrate 205 including the package bond pads 210a/b. One or more passive components 220 (e.g., capacitors) are attached (e.g., using surface mount techniques) to the package substrate 205. FIG. 3B illustrates that the first semiconductor die 225 is attached to the package substrate 205—e.g., using the DCA scheme.

Figure 3C:
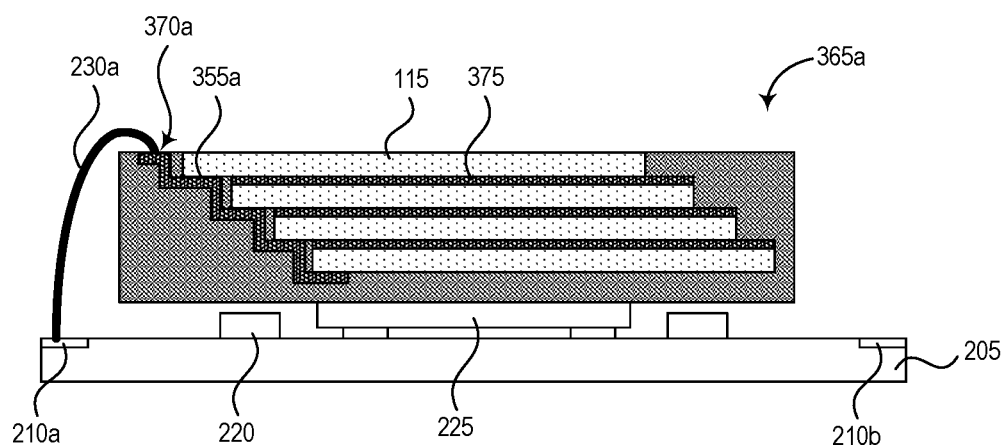

FIG. 3C illustrates that a module 365a including the semiconductor dies 115 has been attached to the first semiconductor die 225—e.g., using DAF (not shown). After attaching the module 365a, the bonding wire 230a can be formed to couple the terminal 370a of the module 365a to the package bond pad 210a. The module 365a may be an example of or include aspects of the module 165 described with reference to FIG. 1J. For example, the module 365a includes semiconductor dies 115 stacked on top of another (e.g., a shingled stack of semiconductor dies 115). In some embodiments, an adhesive layer 375 (e.g., DAF) may be used to form the stack of semiconductor dies 115—e.g., between the semiconductor dies 115. Certain features of the module 165 have been omitted to clearly illustrate the overall features and the principles of the present technology. For example, the dielectric material 125 partially encapsulating the semiconductor dies 115 is not shown for the module 365a. Also, bond pads (e.g., the bond pads 120) of the semiconductor dies 115 are omitted for the module 365a.

Further, the module 365a includes one or more conductive structures 355a configured to provide electrical connections among the semiconductor dies 115. The conductive structures 355a also couple the semiconductor dies 115 with one or more terminals 370a of the module 365a. In some embodiments, the conductive structures 355a may be examples of or include aspects of the conductive structures 155 described with reference to FIG. 1J. In other words, the conductive structures 355a connect bond pads (not shown) of the semiconductor dies 115 to the terminals 370a as described with reference to FIGS. 1E-1J for the conductive structures 155.

In other embodiments, the conductive structures 355a may be examples of or include aspects of other interconnect schemes within the module 365a. By way of example, the semiconductor dies 115 may be operatively connected to each other by using through-substrate vias (TSVs), bumping processes, hybrid bonding processes, or wire bonding processes. Further, the semiconductor dies 115 that are operatively coupled to each other can be coupled to the terminals 370a configured to provide further connections for the module 365a—e.g., to various components external to the module 365a.

Figure 3D:
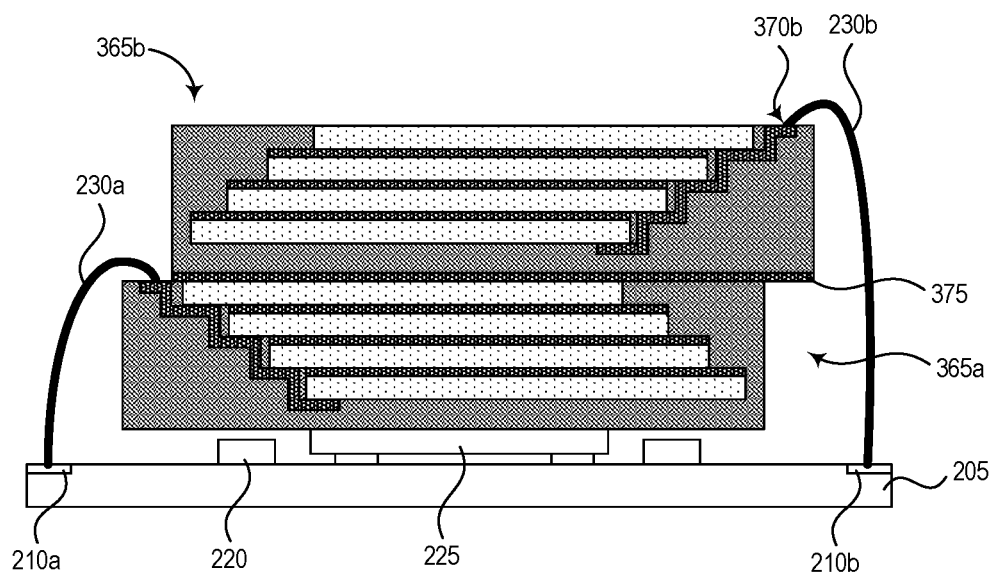

FIG. 3D illustrates that another module 365b including semiconductor dies 115 has been attached to the module 365a—e.g., using another adhesion layer 375. After attaching the module 365b, the bonding wire 230b can be formed to couple the terminal 370b of the module 365b to the package bond pad 210b.

Figure 3E:
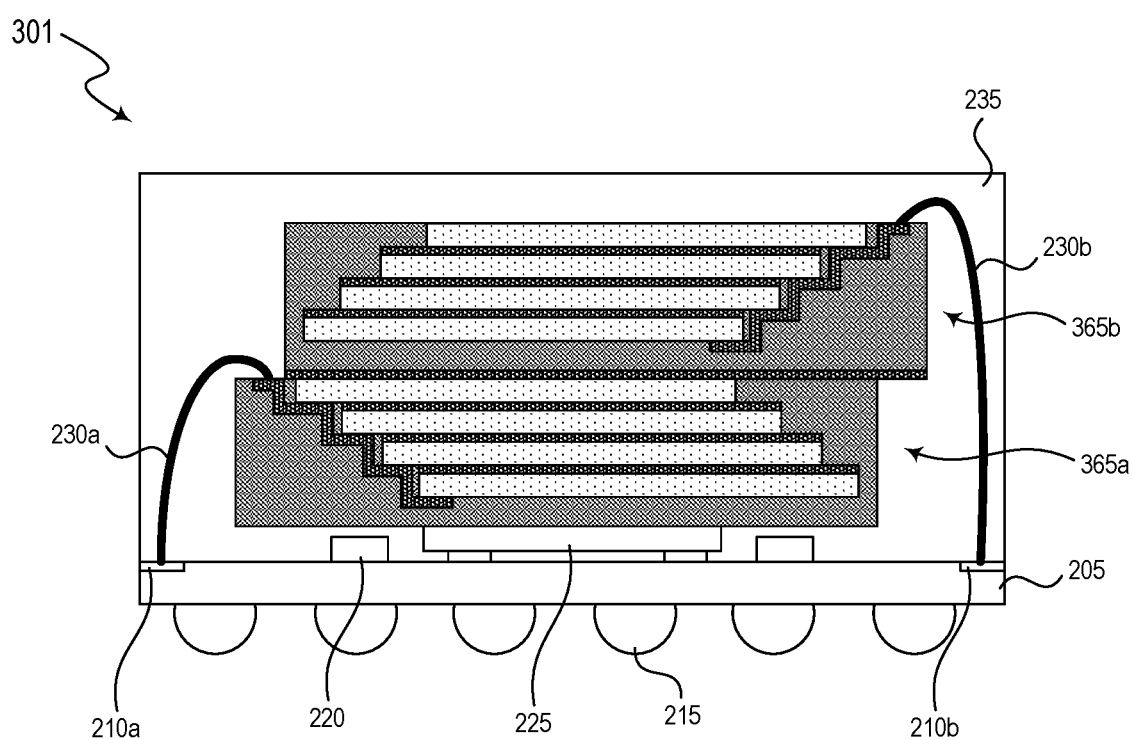

FIG. 3E illustrates that the molding structure 235 are formed to encapsulate the modules 365a/b and the bonding wires 230a/b. Further, the package terminals 215 (e.g., BGA) are formed to complete the semiconductor die assembly 301. Although the semiconductor die assembly 301 is illustrated to include two modules, each including multiple semiconductor dies 115 (e.g., the modules 365a/b), the present technology is not limited thereto. For example, the semiconductor die assembly 301 can include one (1) module, four (4) modules, eight (8) modules, or even greater quantity of modules 365.

The semiconductor die assembly (e.g., the semiconductor die assemblies 201, 301) described above with reference to FIGS. 2 and 3E can be incorporated into any of a myriad of larger and/or more complex systems, a representative example of which is a system 400 shown schematically in FIG. 4. The system 400 can include a semiconductor die assembly 470, a power source 472, a driver 474, a processor 476, and/or other subsystems or components 478. The semiconductor die assembly 470 can include features generally similar to those of the semiconductor die assemblies 201 and/or 301 described above and can therefore include one or more semiconductor die modules (e.g., the modules 165, 365).

In some embodiments, the semiconductor die assembly 470 includes a package substrate including a package bond pad, and a controller die (e.g., a first semiconductor die) attached to the package substrate. Moreover, the semiconductor die assembly 470 includes a memory module (e.g., the modules 165, 365) including a stack of memory dies that are electrically connected to each other, and a molding structure partially encapsulating the stack of memory dies, where a top side of the memory module opposite the controller die includes a surface of the topmost memory die of the stack and a terminal of the memory module operatively coupled with the memory dies of the stack. The semiconductor die assembly 470 further includes a bonding wire connecting the terminal of the memory module to the package bond pad.

In some embodiments, the memory module is a first memory module, and the semiconductor die assembly 470 further comprises a second memory module attached to the first memory module, the second memory module including a stack of second memory dies that are electrically connected to each other, and a second molding structure partially encapsulating the stack of second memory dies, where a second top side of the second memory module opposite the controller die includes a second surface of the topmost second memory die of the stack and a second terminal of the second memory module operatively coupled with the second memory dies of the stack. The semiconductor die assembly 470 further includes a second bonding wire connecting the second terminal of the second memory module to a second package bond pad of the package substrate. In some embodiments, the semiconductor die assembly 470 further includes a passive component attached to the package substrate. In some embodiments, the memory dies of the first memory module are dynamic random access memory (DRAM) dies, and the second memory dies of the second memory module are NOT-AND (NAND) memory dies, or vice versa.

The resulting system 400 can perform any of a wide variety of functions, such as memory storage, data processing, and/or other suitable functions. Accordingly, representative systems 400 can include, without limitation, handheld devices (e.g., mobile phones, tablets, digital readers, and digital audio players), computers, and appliances. Components of the system 400 may be housed in a single unit or distributed over multiple, interconnected units (e.g., through a communications network). The components of the system 400 can also include remote devices and any of a wide variety of computer readable media.

FIG. 5 is a flowchart 500 illustrating a method of forming a semiconductor die assembly configured in accordance with embodiments of the present technology. The method includes stacking two or more semiconductor dies such that each semiconductor die includes a porch uncovered by another semiconductor die, where the porch has one or more bond pads (box 510). The method further includes partially encapsulating the two or more stacked semiconductor dies with a dielectric material (box 515). The method further includes forming openings in the dielectric material, the openings corresponding to the one or more bond pads of the semiconductor dies (box 520). The method further includes forming one or more conductive structures on the dielectric material, where each of the conductive structures extends over at least one porch of the semiconductor dies to connect to the one or more bond pads of the semiconductor dies through corresponding openings (box 525).

In some embodiments, the one or more conductive structures are formed concurrently. In some embodiments, the dielectric material extends to an outer region of a footprint of the two or more stacked of semiconductor dies. In some embodiments, forming the openings in the dielectric material includes forming one or more holes in the dielectric material of the outer region. In some embodiments, forming the one or more conductive structures includes at least partially filling the one or more holes with a conductive material of the one or more conductive structures.

In some embodiments, forming the one or more conductive structures on the dielectric material includes depositing a seed material of the conductive structure in the openings such that the seed material contacts the one or more bond pads. In some embodiments, forming the one or more conductive structures on the dielectric material includes selectively forming a layer of copper on the seed material (e.g., by electroplating copper on the seed material). In some embodiments, the layer of copper corresponds to the one or more conductive structures. In some embodiments, forming the one or more conductive structures on the dielectric material includes removing the seed material uncovered by the layer of copper (e.g., electroplated copper). In some embodiments, the method further includes forming a molding structure over the one or more conductive structures and the dielectric material.

From the foregoing, it will be appreciated that specific embodiments of the technology have been described herein for purposes of illustration, but that various modifications may be made without deviating from the disclosure. For example, although the embodiments of the semiconductor die modules (e.g., the modules 165, 365) are described to include four (4) semiconductor dies, in other embodiments, the semiconductor die modules can be configured to have a different quantity (e.g., two, three, five, six, eight, even more) of semiconductor dies. In addition, while in the illustrated embodiments certain features or components have been shown as having certain arrangements or configurations, other arrangements and configurations are possible. For example, the semiconductor dies 115 stacked on top of another may include more than one porches (each including one or more bond pads) uncovered by another semiconductor dies—e.g., the semiconductor dies with two adjacent, perpendicular porches exposed. Further, the passive components 220 may be attached to anywhere (e.g., not limited to under the semiconductor die modules) in the package substrate. Moreover, certain aspects of the present technology described in the context of particular embodiments may also be combined or eliminated in other embodiments.

The devices discussed herein, including a semiconductor device (or die), may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
    a shingled stack of semiconductor dies, each semiconductor die of the stack including an uncovered porch having one or more bond pads; and
    a plated conductive structure extending over at least one porch of the semiconductor dies to electrically couple the one or more bond pads of the semiconductor dies.

2. The semiconductor die assembly of claim 1, further comprising a dielectric structure partially encapsulating the shingled stack of semiconductor dies, wherein the dielectric structure includes openings corresponding to the bond pads of the semiconductor dies and an outer portion extending outside of a footprint of the shingled stack of semiconductor dies, and wherein the outer portion includes one or more holes that are at least partially filled with a portion of the plated conductive structure.

3. The semiconductor die assembly of claim 2, wherein the plated conductive structure is configured to couple with external interconnects at bottoms of the one or more holes.

4. The semiconductor die assembly of claim 2, wherein the plated conductive structure conforms to corresponding surface profiles of the dielectric structure.

5. The semiconductor die assembly of claim 2, wherein the dielectric structure includes at least one of polyimide, spin-on glass, tetraethoxysilane (TEOS), plasma oxide, oxynitride, and/or silicon carbon nitride.

6. The semiconductor die assembly of claim 1, wherein the bottommost semiconductor die of the stack includes a side uncovered by the dielectric structure.

7. The semiconductor die assembly of claim 1, wherein the plated conductive structure comprises a layer of copper formed on a conductive seed material.

8. A method, comprising:
    stacking two or more semiconductor dies such that each semiconductor die includes a porch uncovered by other ones of the two or more semiconductor dies, wherein the porch has one or more bond pads; and
    forming a plated conductive structure extending over at least one porch of the semiconductor dies to electrically couple the one or more bond pads of the semiconductor dies.

9. The method of claim 8, further comprising:
    partially encapsulating the two or more stacked semiconductor dies with a dielectric material; and
    forming openings in the dielectric material, the openings corresponding to the one or more bond pads of the semiconductor dies.

10. The method of claim 9, wherein the dielectric material extends to an outer region of a footprint of the two or more stacked semiconductor dies.

11. The method of claim 10, wherein forming the openings in the dielectric material includes forming one or more holes in the dielectric material of the outer region.

12. The method of claim 11, wherein forming the plated conductive structure includes at least partially filling the one or more holes with a conductive material.

13. The method of claim 9, wherein forming the plated conductive structure includes depositing a seed material in the openings such that the seed material contacts the one or more bond pads.

14. The method of claim 13, wherein forming the plated conductive structure includes selectively forming a layer of copper on the seed material.

15. The method of claim 14, wherein forming the plated conductive structure includes removing the seed material not covered by the layer of copper.

16. The method of claim 9, further comprising:
forming a molding structure over the plated conductive structure and the dielectric material.

17. A semiconductor die assembly, comprising:
a package substrate including a package bond pad;
a controller die attached to the package substrate;
a memory module attached to the controller die, the memory module including:
　a stack of memory dies that are electrically connected to each other by a plated conductive structure; and
　a molding structure partially encapsulating the stack of memory dies, wherein a top side of the memory module opposite the controller die includes a surface of the topmost memory die of the stack and a portion of the plated conductive structure; and
a bonding wire connecting the portion of the plated conductive structure to the package bond pad.

18. The semiconductor die assembly of claim 17, further comprising:
a passive component attached to the package substrate, wherein:
the stack of memory dies forms a shingled stack, each memory die including an uncovered porch having one or more bond pads;
a dielectric structure of the memory module partially encapsulates the stack of memory dies, the dielectric structure including openings corresponding to the bond pads of the memory dies; and
the plated conductive structure disposed on the dielectric structure and extending over at least one porch of the memory dies to connect to at least one bond pad of the memory dies through at least one corresponding opening of the dielectric structure.

19. The semiconductor die assembly of claim 17, wherein the memory module is a first memory module, and the semiconductor die assembly further comprises:
a second memory module attached to the first memory module, the second memory module including:
　a stack of second memory dies that are electrically connected to each other by a second plated conductive structure; and
　a second molding structure partially encapsulating the stack of second memory dies, wherein a second top side of the second memory module opposite the controller die includes a second surface of the topmost second memory die of the stack and a second portion of the second plated conductive structure; and
a second bonding wire connecting the second portion of the second plated conductive structure to a second package bond pad of the package substrate.

20. The semiconductor die assembly of claim 19, further comprising:
a passive component attached to the package substrate, wherein:
the memory dies of the first memory module are dynamic random access memory (DRAM) dies; and
the second memory dies of the second memory module are NOT-AND (NANO) memory dies.

* * * * *